United States Patent [19]

Barlow et al.

[11] 4,380,745

[45] Apr. 19, 1983

[54] DIGITALLY CONTROLLED TEMPERATURE COMPENSATED OSCILLATOR SYSTEM

[75] Inventors: Michael L. Barlow, Silverdale; Alan L. Lindstrum, Bainbridge Island, both of Wash.

[73] Assignee: The United States of America as represented by the Secretary of the Navy, Washington, D.C.

[21] Appl. No.: 205,027

[22] Filed: Nov. 7, 1980

[51] Int. Cl.³ .............................................. H03L 1/02
[52] U.S. Cl. ...................................... 331/176; 331/66
[58] Field of Search .......................... 331/176, 66, 158

[56] References Cited

U.S. PATENT DOCUMENTS 3,938,316  2/1976  Morokawa et al. ............ 331/176 X
3,978,650  9/1976  Hashimoto et al. ............ 331/176 X

FOREIGN PATENT DOCUMENTS 55-76978  6/1980  Japan .................................. 331/176

Primary Examiner—Siegfried H. Grimm
Attorney, Agent, or Firm—R. S. Sciascia; Charles D. B. Curry

[57] ABSTRACT

A crystal oscillator that is temperature compensated by digitally substracting a correction frequency from the running frequency of the crystal oscillator to provide the required operating frequency. The correction frequency is generated by a digital frequency synthesizer circuit which is controlled by the output of a programmable read-only memory which has been programmed to generate the required correction frequency for each temperature code over the operating temperature range. The temperature code is generated by gating a digital counter with the output of a monostable multivibrator which utilizes a thermistor to make its gate interval proportional to temperature.

3 Claims, 4 Drawing Figures

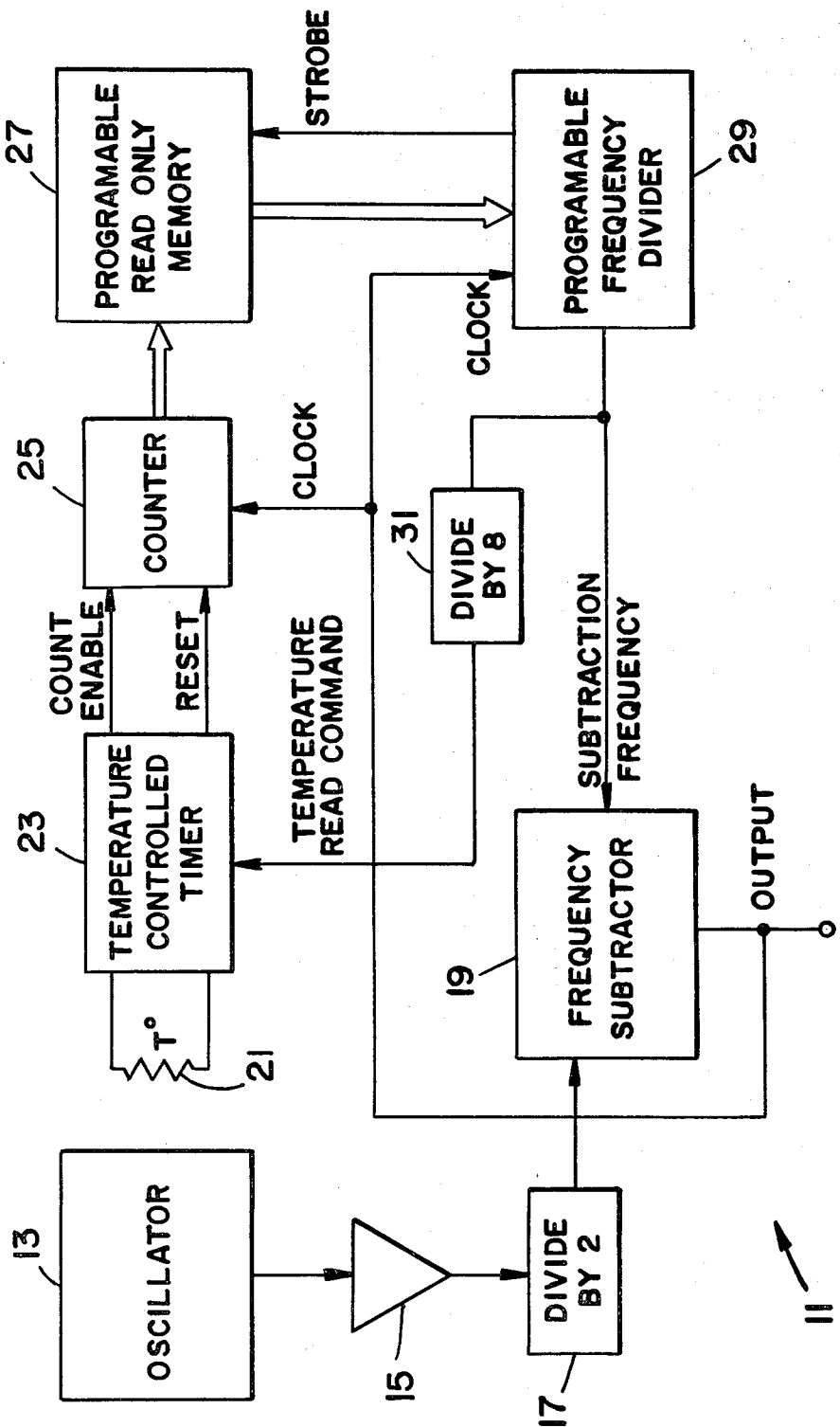
FIG_1

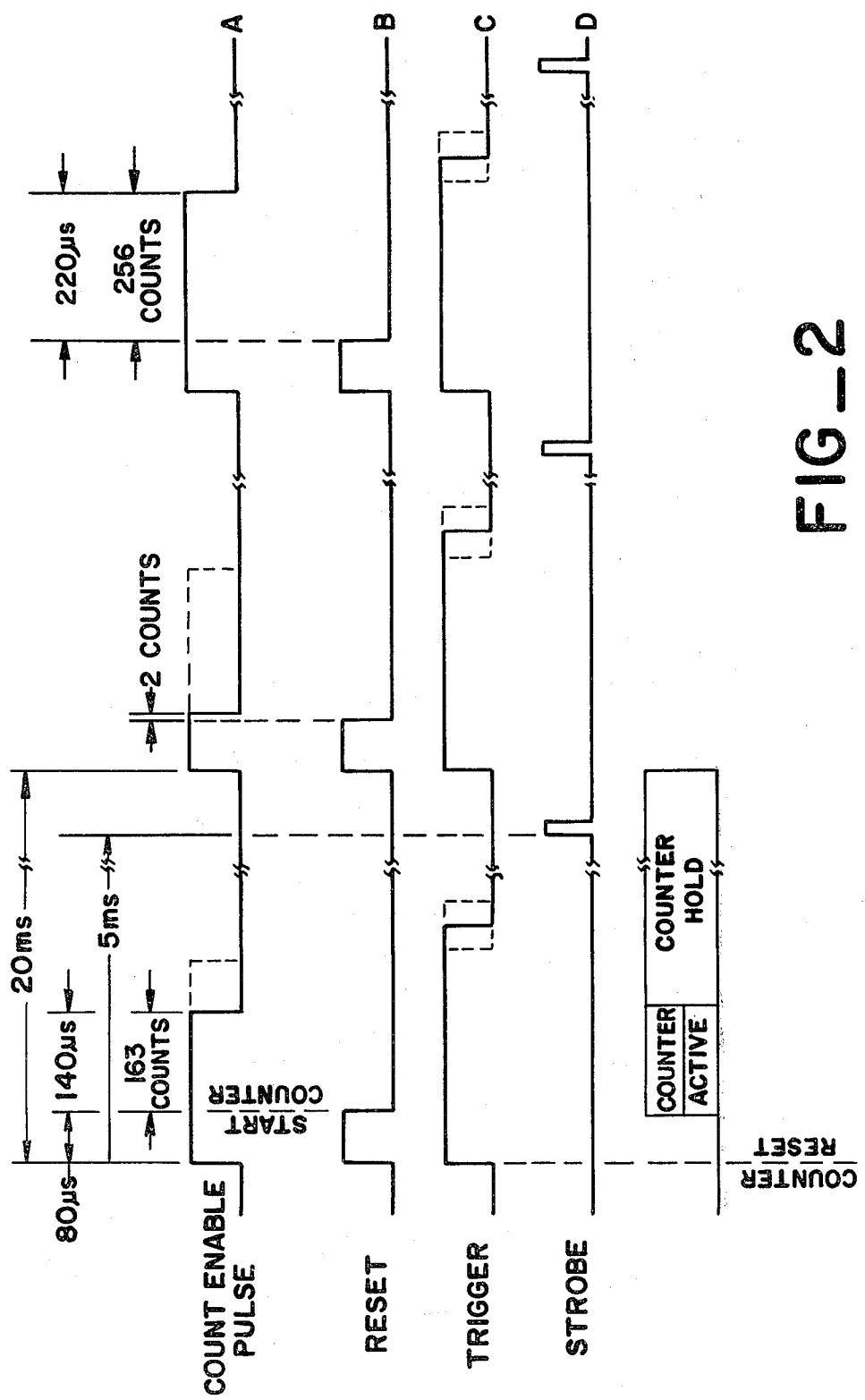
FIG_2

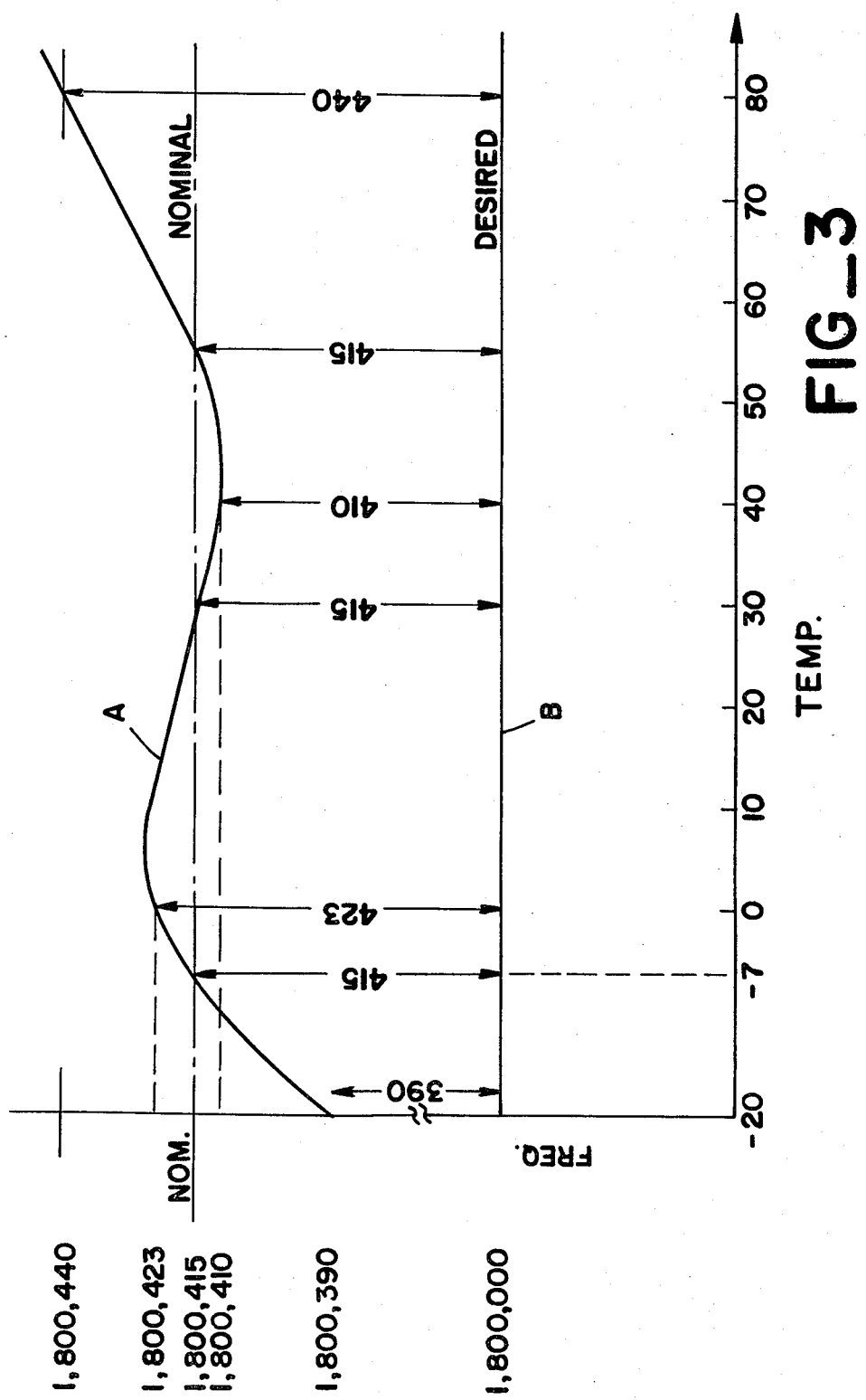
FIG_3

| TEMP | FREQ. OF OSC. 13 | FREQ. OF OUTPUT OF ÷2 CIRCUIT 17 | VALUE AT ADDRESS IN MEMORY 27 | OUTPUT FROM DIVIDER 29 |
|---|---|---|---|---|
| -20 | 3,600,780 | 1,800,390 | 00000000 | 390 |
| -15 | | | | |
| -10 | | | | |
| -7 | 3,600,830 | 1,800,415 | 10000000 | 415 |
| -5 | | | | |
| 0 | 3,600,846 | 1,800,423 | 10101001 | 423 |
| 5 | | | | |
| 10 | | | | |
| 15 | | | | |
| 20 | | | | |
| 25 | | | | |
| 30 | 3,600,830 | 1,800,415 | 10000000 | 415 |
| 35 | | | | |
| 40 | 3,600,820 | 1,800,420 | 01100110 | 410 |
| 45 | | | | |
| 50 | | | | |
| 54 | 3,600,830 | 1,800,415 | 10000000 | 415 |
| 60 | | | | |
| 65 | | | | |
| 70 | | | | |
| 75 | | | | |
| 80 | 3,600,880 | 1,800,440 | 11111111 | 440 |

FIG_4

DIGITALLY CONTROLLED TEMPERATURE COMPENSATED OSCILLATOR SYSTEM

BACKGROUND OF THE INVENTION

1. Field of the Invention

The present invention relates to a temperature compensated oscillator and more specifically to a digitally controlled temperature compensated oscillator system.

2. Description of the Prior Art

As technology advances there is an increasing need for highly precise oscillators that provide a constant output frequency over wide temperature ranges. Many attempts have been made to provide precise temperature compensation, especially in crystal oscillators, with both active and passive electronic components. While these attempts have provided substantial advances in accuracy they have failed to provide the precision desired and necessary for many high technology applications.

These problems have been overcome by the present invention by providing a digital system that provides exceptionally precise temperature compensation for an already temperature compensated crystal oscillator.

SUMMARY OF THE INVENTION

Briefly, the present invention comprises a crystal oscillator that is temperature compensated by digitally subtracting a correction frequency from the running frequency of the crystal oscillator to provide the required operating frequency. The correction frequency is generated by a digital frequency synthesizer circuit which is controlled by the output of a programmable readonly memory which has been programmed to generate the required correction frequency for each temperature code over the operating temperature range. The temperature code is generated by gating a digital counter with the output of a monostable multivibrator that employs a thermistor to make its gate interval proportional to temperature. This invention addresses those applications where long term timing stability is the principal requirement rather than short term frequency accuracy.

STATEMENT OF THE OBJECTS OF THE INVENTION

An object of the present invention is to provide an oscillator system that has a constant frequency over a wide temperature range of operation.

A further object of the present invention is to provide a digitally controlling temperature compensated crystal oscillator system.

A still further object of the present invention is to provide a digitally compensated oscillator system that is more precise over its entire temperature range of operation than previously attainable with passive and active analog components.

Other objects, advantages and novel features of the invention will become apparent from the following detailed description of the invention when considered in conjunction with the accompanying drawings wherein:

BRIEF DESCRIPTION OF THE DRAWINGS

FIG. 1 is a schematic drawing of the digitally controlled temperature compensated oscillator system of the present invention;

FIG. 2 is a timing diagram illustrating the operation of the system shown in FIG. 1;

FIG. 3 is a plurality of curves illustrating the basic concepts of operation of the system shown in FIG. 1; and FIG. 4 is a chart illustrating the implementation of the basic concepts of operation of the system shown in FIG. 1 and the curves of FIG. 3.

DESCRIPTION OF THE PREFERRED EMBODIMENT

In FIG. 1 is shown a schematic diagram of the digitally controlled temperature compensated oscillator system 11 of the present invention. This system includes oscillator 13, which is preferably a crystal oscillator, having a nominal frequency of 3.60083 MHz or 3,600,830 Hz. The output of oscillator 13 is connected to the input of buffer 15, the output of which is connected to the input of ÷2 circuit 17, the output of which is connected to frequency subtractor 19. Oscillator 13 is subjected to environmental conditions which will include variations of temperature. The desired frequency output is, in this example, 1.8 MHz. Oscillator 13 is selected to be at a higher frequency than the desired frequency for two principal reasons. First, the higher frequency oscillator is generally more stable and second the circuit implementation is less complex where the frequency correction is always in one direction. The function of buffer 15 is to square the signal and provide a constant voltage output, for example, 10 volts. The function of ÷2 circuit 17 is to reduce the frequency to a value that approaches the desired output frequency and can be corrected downward to the exact desired output frequency of 1.8 MHz or 1,800,000 Hz. For example, when oscillator 13 is operating at the nominal temperature and providing a frequency of 3,600,830 Hz the output of ÷2 circuit 17 is 1,800,415 Hz and the nominal correction in frequency subtractor 19 is 415 Hz. This is shown as the "subtraction frequency" in FIG. 1. These nominal conditions will result in the desired output frequency of 1,800,000 Hz (1,800,415–415 Hz).

The temperature of the environment to which oscillator 13 is subjected is measured by thermistor 21 which may be of the positive temperature coefficient silicon type. The output of thermistor 21 is connected to temperature controlled timer 23, the output of which is connected to the input of 8-bit counter 25, the output of which is connected to programmable read-only memory 27, the output of which is connected to programmable frequency divider 29, the output of which is connected to the subtraction input of frequency subtractor 19 and to the input of divide circuit 31 (÷8, for example). The output of circuit 31 is applied to the trigger input of temperature controlled timer 23.

The output of frequency subtractor 19 (1.8 MHz) is supplied to the using circuits, not shown, and to the clock input of 8-bit counter 25 and to the input of frequency divider 29.

In FIG. 2 is shown a timing diagram illustrating the operation of the temperature controlled timer 23. The process is initiated by the application of a trigger pulse from divide circuit 31 to one input of timer 23. In timer 23 this trigger signal is applied to a monostable multivibrator, not shown, which has a time constant of about 80 μs in this example. It should be noted that the time duration of the trigger signal will vary as shown by the dotted lines of curve C of FIG. 2. However, this will not effect operation since the leading edge actuates the multivibrator and the maximum time duration is substantially less than the overall cycle time of about 20 ms. The trailing edge of the reset signal (curve B) initiates the 8-bit counter into the counting mode of the clock frequency of 1.8 MHz. This counting process will continue until the count enable pulse terminates (trailing edge of the curve A signal). The time duration of the count enable pulse is dependent upon the temperature of thermistor 21 and will vary from slightly more than 80 μs to about 220 μs (80 μs+140 μs) in this example. This range is demonstrated in the second and third pulses of curve A respectively. In this example, the first pulse of curve A would have a count of about 163, the second pulse a count of about 2, and the third pulse the maximum count of 256. These counts can all be represented by an 8-bit signal. After the count is made by 8-bit counter 25 it is held to the end of the cycle as shown in the bottom curve of FIG. 2.

The 8-bit counter of counter 25 provides the address code for read-only memory 27. The information held in the particular address is read out to frequency divider 29 upon the application of the strobe pulse to memory 27. The strobe pulse is applied after the time required for the maximum count (that is, the time of the third pulse of curve A of 220 μs) and within sufficient time for system processing of the information (and before the next system cycle that occurs each 20 ms in this example). In this example the strobe pulse, curve D of FIG. 2, is selected to be 5 ms.

It should be noted that the clock frequency of 1.8 MHz is applied to the clock input of programmable frequency divider 29. The number of division stages that is applied to the clock signal is determined by the 8-bit code supplied by memory 27 as addressed by the 8-bit code from counter 25. In this example the frequency range output, as determined by the 8-bit code from memory 27, is from about 390 to 440 Hz with a nominal or center frequency of 415 Hz.

In FIG. 3 is shown a plurality of curves which illustrate the operation of the temperature compensated oscillator system 11. Curve A represents a typical frequency v. temperature curve for temperature compensated oscillators operating in the low megahertz region, such as oscillator 13. It should be noted that even with the most precise state of the art controls there will be a variation in frequency over the ambient temperature range. For many applications it is desirable and even essential that the output frequency very nearly approach an exactly constant frequency over the entire frequency range as shown by curve B. In this example, the desired frequency is 1.8 MHz or 1,800,000 Hz. In accordance with the present invention curve B is attained by knowing the temperature v. frequency characteristics curve of oscillator 13 (curve A) and knowing the temperature at which it is operating (obtained by thermistor 21 of FIG. 1) and then subtracting a value (shown by the double arrow lines of FIG. 3) from the actual oscillator frequency that results in the desired frequency of 1,800,000 Hz (subtractor 19). The value that is to be subtracted is determined by thermistor 21, timer 23, 8-bit counter 25, programmable memory 27 and divider 29 as previously described and as further illustrated in FIG. 4.

Referring to FIGS. 3 and 4, in accordance with the characteristic curve A, the nominal frequency will occur at the temperature of −7°, 30° and 54° C. At each of these temperatures 8-bit counter 25 will provide a code (in this example, 10000000) that will address the code stored in programmable memory 27 that results in frequency divider providing an output frequency of 415 Hz. When this 415 Hz frequency is subtracted from the 1,800,415 Hz input frequency signal applied by ÷2 circuit 17 to frequency subtractor 19, it will result in an output from frequency subtractor 19 of exactly 1,800,000 Hz. If the system is operating at 0° C. then the subtraction value will be 423 Hz, at −20° C. 390 Hz, at +80° C. 440 Hz, at +40° C. 410 Hz, and so forth throughout the entire temperature range. The degree of resolution will be determined by the number of stages in divider 29 and number of bits used in counter 25 and in memory 27.

What is claimed is:

1. A temperature-compensated oscillator system for producing a system output signal of a constant frequency, which comprises:
   (a) an oscillator having a known output frequency versus temperature characteristic;
   (b) a temperature sensor for producing a first output signal proportional to the temperature at which the oscillator is operating;
   (c) a temperature-controlled timer coupled to receive the first output signal, said temperature controlled timer producing a second output signal having a duration which is related to the temperature sensed by said temperature sensor;
   (d) means for converting said second output signal to a first binary number representing the temperature sensed by said temperature sensor;
   (e) a programmable memory coupled to receive said first binary number on its address input, the memory address identified by said first binary number containing a second binary number representing an error frequency to adjust the frequency of the output signal from the oscillator;
   (f) means for generating a signal having said error frequency in response to said second binary number, said means for generating coupled to receive said addressed second binary number; and
   (g) means for combining said signal at said error frequency with the output signal from said oscillator to produce said temperature-compensated system output signal.

2. A system as recited in claim 1 wherein said means for converting said second output signal to a first binary number comprises:
   (a) a binary counter coupled to be enabled by said second output signal and having its clock input coupled to the system output signal.

3. A system recited in claim 2 wherein said means for generating a signal having said error frequency includes:
   (a) a programmable frequency divider coupled to be programmed by said second binary number from said programmable memory and having its clock input coupled to the system output signals.

* * * * *